United States Patent
Koenigsmann et al.

(10) Patent No.: US 10,715,055 B2
(45) Date of Patent: Jul. 14, 2020

(54) POWER SEMICONDUCTOR CIRCUIT HAVING A FIELD EFFECT TRANSISTOR WITH LOW ENERGY LOSSES

(71) Applicant: Semikron Elektronik GmbH & Co., KG, Nürnberg (DE)

(72) Inventors: Gunter Koenigsmann, Erlangen-Tennenlohe (DE); Thomas Eck, Burgthann (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 15/199,969

(22) Filed: Jun. 30, 2016

(65) Prior Publication Data

US 2017/0005594 A1     Jan. 5, 2017

(30) Foreign Application Priority Data

Jun. 30, 2015    (DE) .......................... 10 2015 110 513

(51) Int. Cl.
*H02M 1/32*     (2007.01)
*H02M 7/5387*     (2007.01)
(Continued)

(52) U.S. Cl.
CPC ...... *H02M 7/53871* (2013.01); *G01R 19/165* (2013.01); *H02M 1/32* (2013.01); *H03K 17/0822* (2013.01); *H03K 2217/0036* (2013.01)

(58) Field of Classification Search
CPC .......... H02M 2001/0009; H02M 1/32; H02M 7/53871; H03K 17/0822; H03K 2217/0036; G01R 19/165; G01R 19/16519
See application file for complete search history.

(56) References Cited

U.S. PATENT DOCUMENTS 4,697,230 A * 9/1987 Neft .......................... H02M 3/10
                                                                                                 361/88
4,706,158 A * 11/1987 Todaro ..................... H02H 3/24
                                                                                                361/187
(Continued)

FOREIGN PATENT DOCUMENTS

DE     10 2011 087 087     8/2012
WO        2004/114509 A1    12/2004

OTHER PUBLICATIONS

Examination Report of the German Patent Office (DPMA) in corresponding priority case; dated Mar. 17, 2016.

*Primary Examiner* — Jue Zhang
*Assistant Examiner* — David A. Singh
(74) *Attorney, Agent, or Firm* — The Law Office of Roger S. Thompson

(57) ABSTRACT

A power semiconductor circuit comprising a field effect transistor having a drain, a source and a gate as terminals, and further comprising a control device having a drive device and an undervoltage detection circuit. The drive device drives the field effect transistor and is electrically connected to the gate of the field effect transistor. The undervoltage detection circuit generates an undervoltage detection signal if a power semiconductor voltage present between the drain and the source of the field effect transistor falls below a specific voltage value. The drive device switches on the field effect transistor when a switch-on command for switching on the field effect transistor and the undervoltage detection signal are present. The invention provides a power semiconductor circuit with low energy loss.

11 Claims, 2 Drawing Sheets

(51) Int. Cl.
   *H03K 17/082*   (2006.01)
   *G01R 19/165*   (2006.01)

(56) References Cited

U.S. PATENT DOCUMENTS

| | | | | |
|---|---|---|---|---|
| 6,388,433 | B2* | 5/2002 | Marty | G05F 1/565 |
| | | | | 323/274 |
| 8,129,962 | B2* | 3/2012 | Xie | G05F 1/565 |
| | | | | 323/269 |
| 8,553,430 | B2 | 10/2013 | Melanson et al. | |
| 2002/0159276 | A1* | 10/2002 | Deboy | H02M 3/33507 |
| | | | | 363/20 |
| 2008/0001586 | A1* | 1/2008 | Kuehner | H03K 4/02 |
| | | | | 323/282 |
| 2009/0268494 | A1* | 10/2009 | Hu | H02M 1/08 |
| | | | | 363/89 |
| 2012/0313596 | A1* | 12/2012 | Heid | H01J 37/32009 |
| | | | | 323/271 |
| 2016/0164413 | A1* | 6/2016 | Akiyama | H03K 17/04206 |
| | | | | 323/271 |
| 2016/0294298 | A1* | 10/2016 | Wong | H02M 3/33592 |
| 2016/0344381 | A1* | 11/2016 | Cai | H03K 17/04106 |

* cited by examiner

POWER SEMICONDUCTOR CIRCUIT HAVING A FIELD EFFECT TRANSISTOR WITH LOW ENERGY LOSSES

BACKGROUND OF THE INVENTION

1. Field of the Invention

The invention is directed to a power semiconductor circuit comprising a field effect transistor.

2. Description of the Related Art

Known power semiconductor circuits as are customary in the art, such as, e.g., from DE 10 2011 087 087 A1, respectively comprise a power semiconductor switch embodied in particular as a Metal-Oxide-Semiconductor Field-Effect Transistor (MOSFET) and a drive device for driving the power semiconductor switch. In general, half-bridge circuit arrangements are formed here by the power semiconductor switches of a first and a second power semiconductor circuit being electrically connected in series. Half-bridge circuit arrangements are often used for rectifying and inverting electrical voltages and currents. In this case, generally a DC voltage is applied to the half-bridge circuit arrangement and the electrical center node at which the power semiconductor switches of the first and second power semiconductor circuits are electrically connected to one another is connected via an electrical line to an electrical load such as, e.g., an AC motor or an AC electricity grid.

As known, e.g. from U.S. Pat. No. 8,553,430 B2, the electrically series-connected power semiconductor switches of the power semiconductor circuits of a half-bridge circuit arrangement are generally switched on and off alternately relative to one another.

By way of example, field effect transistors such as e.g. MOSFETs or Junction gate Field Effect Transistors (JFETs), are used as power semiconductor switches. Freewheeling diodes are connected in antiparallel with the power semiconductor switches. If, referring to FIG. 1, for example, the upper MOSFET T1 is switched on and a current I flows through the electrical line to an AC voltage terminal AC, and the upper MOSFET T1 is subsequently switched off, then the current I, owing to the parasitic inductance Lp of the electrical line or the inductance of the load (not illustrated) connected to AC voltage terminal AC, continues to flow through a lower freewheeling diode D' or D", which is electrically connected in antiparallel with a lower power semiconductor switch T2. Owing to the generally relatively high threshold voltage of the freewheeling diode D' or D", relatively high energy losses thus arise at the freewheeling diode D' or D", such that the lower power semiconductor circuit 4' or the half-bridge circuit arrangement 1 has high energy losses.

Field effect transistors have the property that when they are switched on, they can conduct current in the reverse direction as well, i.e., in the direction from the source to the drain of the field effect transistor in the case of n-channel field effect transistors and in the direction from the drain to the source of the field effect transistor in the case of p-channel field effect transistors, without being destroyed or damaged. This property is used customarily in the art to reduce the energy losses at the freewheeling diode D' or D". For this purpose, customarily in the art after a specific fixedly allocated time duration after e.g., the upper MOSFET T1 has received a switch-off signal, the lower MOSFET T2 is switched on and thus in FIG. 1 the lower freewheeling diode D' or D" is bridged by the MOSFET T2, which reduces the energy losses of the power semiconductor circuits. In order to prevent high parallel-path currents or short-circuit currents through the half-bridge circuit arrangement from arising, it is necessary to prevent the lower MOSFET T2 from being switched on while the upper MOSFET T1 is still at the beginning of its switch-off process and still has a residual on-state conductivity. Therefore, the fixedly predefined time duration mentioned above is chosen with a magnitude such that for a relatively long time, the entire current I flows through the lower freewheeling diode D' or D" in FIG. 1 before said freewheeling diode is bridged by the MOSFET T2 as a result of the lower MOSFET T2 being switched on, such that relatively high energy losses still arise at the freewheeling diode D' or D".

SUMMARY OF THE INVENTION

It is therefore an object of the invention is to provide an improved power semiconductor circuit comprising a field effect transistor with low energy losses.

This object is achieved by means of a power semiconductor circuit comprising a field effect transistor having a drain, a source and a gate as terminals, and comprising a control device having a drive device and an undervoltage detection circuit, wherein the drive device is designed for driving the field effect transistor and is electrically connected to the gate of the field effect transistor, wherein the undervoltage detection circuit is designed to generate an undervoltage detection signal if a power semiconductor voltage present between the drain and the source of the field effect transistor falls below a specific voltage value, and wherein the drive device is designed to switch on the field effect transistor when a switch-on command for switching on the field effect transistor and the undervoltage detection signal are present.

It proves to be advantageous if the specific voltage value is between a negative value whose absolute value is 90% of the threshold voltage of an antiparallel-connected internal freewheeling diode of the field effect transistor or of an external freewheeling diode connected in antiparallel with the field effect transistor and +30% of the power semiconductor voltage present in steady-state fashion in the switched-off state of the field effect transistor during the operation of the power semiconductor circuit, since then at most for a short time relatively little to no parallel-path currents at all occur.

Furthermore, it proves to be advantageous if the value of the specific voltage value is dependent on the rate of change of the power semiconductor voltage that occurs directly before the field effect transistor is switched on, and at a higher rate of change of the power semiconductor voltage said value is higher than at a low rate of change. As a result, operation of the power semiconductor circuit with as little energy loss as possible is ensured even in the case of greatly varying load or operating conditions occurring during the operation of the power semiconductor circuit.

Furthermore, it proves to be advantageous if the field effect transistor is embodied as a MOSFET or JFET, since customary embodiments of field effect transistors are involved in this case.

Furthermore, it proves to be advantageous if the field effect transistor is embodied as an n-channel field effect transistor, wherein the undervoltage detection circuit has a limit value monitoring unit, a first diode, a first capacitor and an electrical resistor, wherein a first input of the limit value monitoring unit, a first terminal of the first capacitor, the anode of the first diode and the first terminal of the resistor are electrically connected to an electrical circuit node, wherein the cathode of the first diode is electrically connected to the drain of the field effect transistor, wherein a second terminal of the first capacitor is electrically connected to the source of the field effect transistor, wherein the limit value monitoring unit is designed to generate an undervoltage detection signal if the power semiconductor voltage present between drain and source of the field effect transistor falls below the specific voltage value, such that the electrical voltage present between the first input of the limit value monitoring unit and the source of the field effect transistor thus falls below a reference voltage present at the second input of the limit value monitoring unit. The undervoltage detection circuit is then embodied particularly simply and reliably.

Furthermore, it proves to be advantageous if the field effect transistor is embodied as a p-channel field effect transistor, wherein the undervoltage detection circuit has a limit value monitoring unit, a first capacitor, a first diode and an electrical resistor, wherein a first input of the limit value monitoring unit, a first terminal of the first capacitor, the cathode of the first diode and the first terminal of the resistor are electrically connected to an electrical circuit node, wherein the anode of the first diode is electrically connected to the drain of the field effect transistor, wherein a second terminal of the first capacitor is electrically connected to the source of the field effect transistor, wherein the limit value monitoring unit is designed to generate an undervoltage detection signal if the power semiconductor voltage present between drain and source of the field effect transistor falls below the specific voltage value, such that the electrical voltage present between the first input of the limit value monitoring unit and the source of the field effect transistor thus falls below a reference voltage present at the second input of the limit value monitoring unit. The undervoltage detection circuit is then embodied particularly simply and reliably.

Furthermore, it proves to be advantageous if the limit value monitoring unit has a second capacitor instead of, or in addition to, the first diode, wherein a first terminal of the second capacitor is electrically connected to the electrical circuit node and a second terminal of the second capacitor is electrically connected to the drain of the field effect transistor. As a result, the above-described dependence of the specific voltage value on the rate of change of the power semiconductor voltage that occurs directly before the field effect transistor is switched on can be achieved in a simple manner, such that at a higher rate of change of the power semiconductor voltage the value of the specific voltage value is higher than at a low rate of change.

Furthermore, a semiconductor bridge circuit arrangement comprising a first and a second power semiconductor circuit according to the invention, wherein the field effect transistor of the second power semiconductor circuit is electrically connected in series with the field effect transistor of the first power semiconductor circuit, proves to be advantageous. A semiconductor bridge circuit arrangement with low energy loss is provided thereby.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
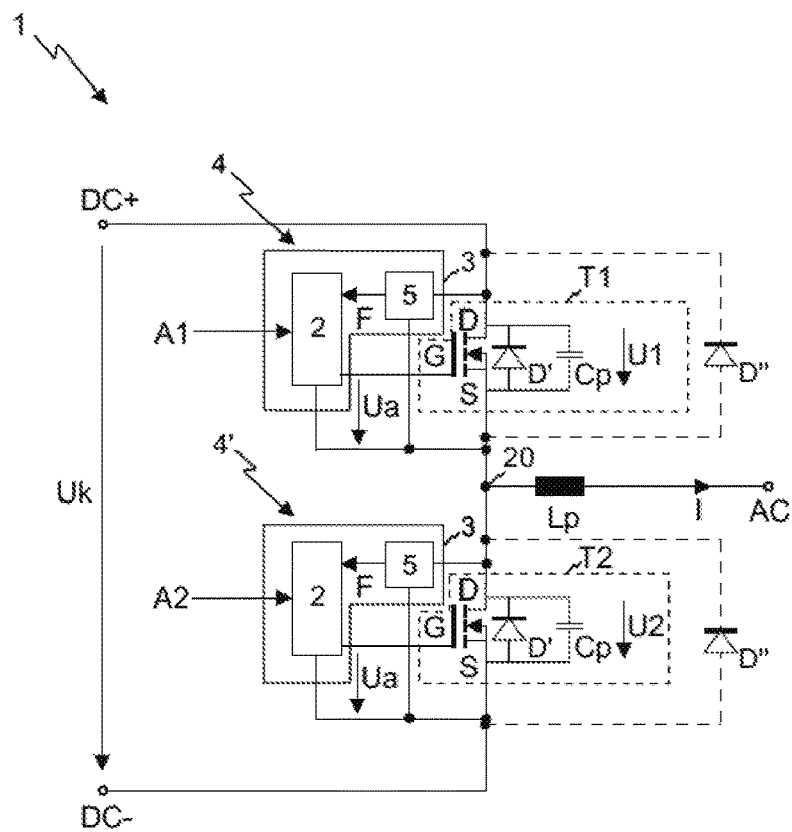
FIG. 1 shows a semiconductor bridge circuit arrangement comprising a first and a second power semiconductor circuit in accordance with the invention.

FIG. 1 shows an inventive semiconductor bridge circuit arrangement 1 comprising a first and a second power semiconductor circuit 4 and 4' according to the invention, wherein first and second power semiconductor circuits 4 and 4' are embodied identically. First power semiconductor circuit 4 comprises a first field effect transistor T1 and second power semiconductor circuit 4' comprises a second field effect transistor T2, which are respectively embodied as MOSFETs in the context of the exemplary embodiment. A freewheeling diode D' and/or D" is respectively electrically connected in anti-parallel with first field effect transistor T1 and second field effect transistor T2. If power semiconductor switches T1 are present in the form of MOSFETs, then the freewheeling diode is generally an integral part of the respective MOSFET and is not present as a discrete component, such that in the exemplary embodiment the freewheeling diode is present in the form of the internal freewheeling diode D' of the respective field effect transistor T1 and T2. As illustrated in a manner depicted by dashed lines in FIG. 1, in addition an external freewheeling diode D" can also respectively be electrically connected in antiparallel with first field effect transistor T1 and second field effect transistor T2.

First and second field effect transistors T1 and T2 respectively have a drain, a source and a gate as terminals. First and second field effect transistors T1 and T2 respectively have a parasitic capacitance $C_p$ between drain and source.

First and second field effect transistors T1 and T2 are electrically connected in series, wherein a DC voltage Uk is present across this series connection in the context of the exemplary embodiment. The DC voltage Uk is fed in via the DC voltage terminals DC+ and DC− of the half-bridge circuit arrangement 1. The electrical center node 20 at which the first and second power semiconductor switches T1 and T2 are electrically connected to one another is electrically connected to an AC voltage terminal AC of half-bridge circuit arrangement 1 via an electrical line of half-bridge circuit arrangement 1 which has a parasitic line inductance $L_p$. The AC voltage terminal AC is electrically connected to an electrical load such as, for example, an AC motor or an AC electricity grid (not illustrated in FIG. 1).

During the operation of half-bridge circuit arrangement 1, in the context of the exemplary embodiment, first and second power semiconductor switches T1 and T2 are switched on and off alternately relative to one another. If first power semiconductor switch T1 is switched on, then second power semiconductor switch T2 is switched off, and vice versa.

A power semiconductor voltage U1 is present between the drain D and the source S of first field effect transistor T1 and power semiconductor voltage U2 is present between drain D and source S of second field effect transistor T2.

It should be noted here that, within the meaning of the present invention, if first field effect transistor T1 is embodied as an n-channel field effect transistor, power semiconductor voltage U1 is relative to source S of first field effect transistor T1 and, if first field effect transistor T1 is embodied as a p-channel field effect transistor, power semiconductor voltage U1 is relative to drain D of first field effect transistor T1.

It should furthermore be noted here that, within the meaning of the present invention, if second field effect transistor T2 is embodied as an n-channel field effect transistor, power semiconductor voltage U2 is relative to source S of second field effect transistor T2 and, if second field effect transistor T2 is embodied as a p-channel field effect transistor, power semiconductor voltage U2 is relative to drain D of second field effect transistor T2.

Figure 3:
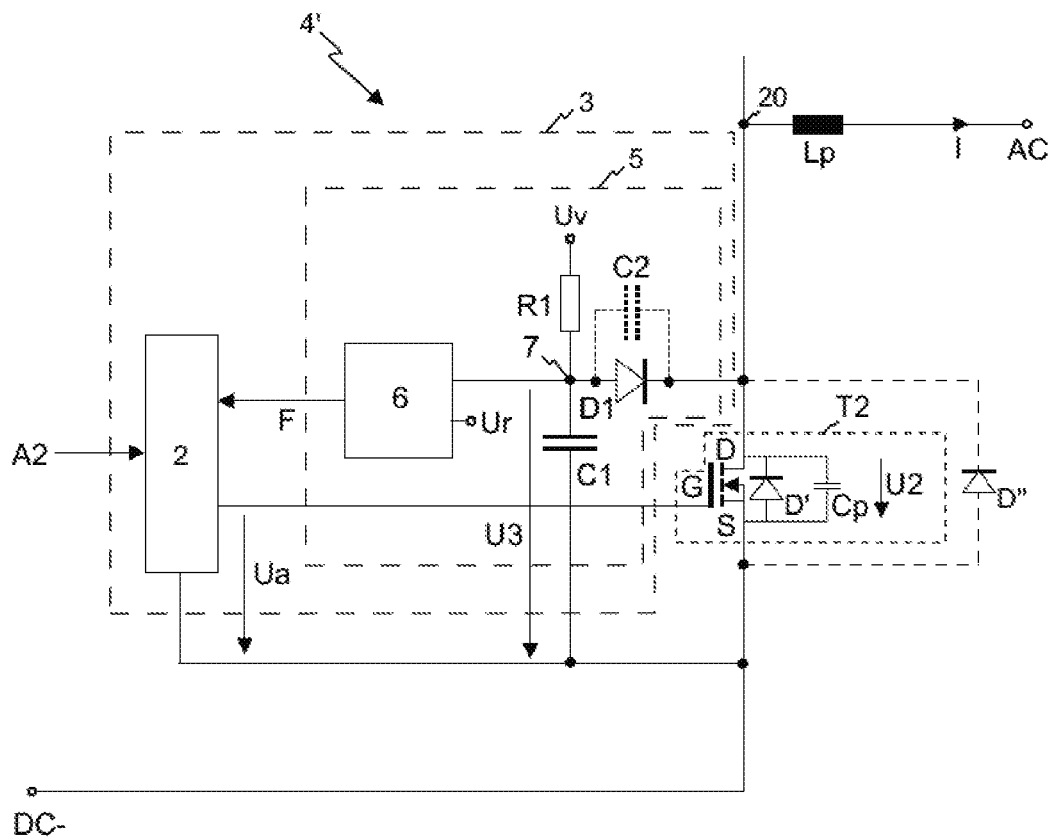
FIG. 3 shows a power semiconductor circuit according to the invention.
Figure 4:
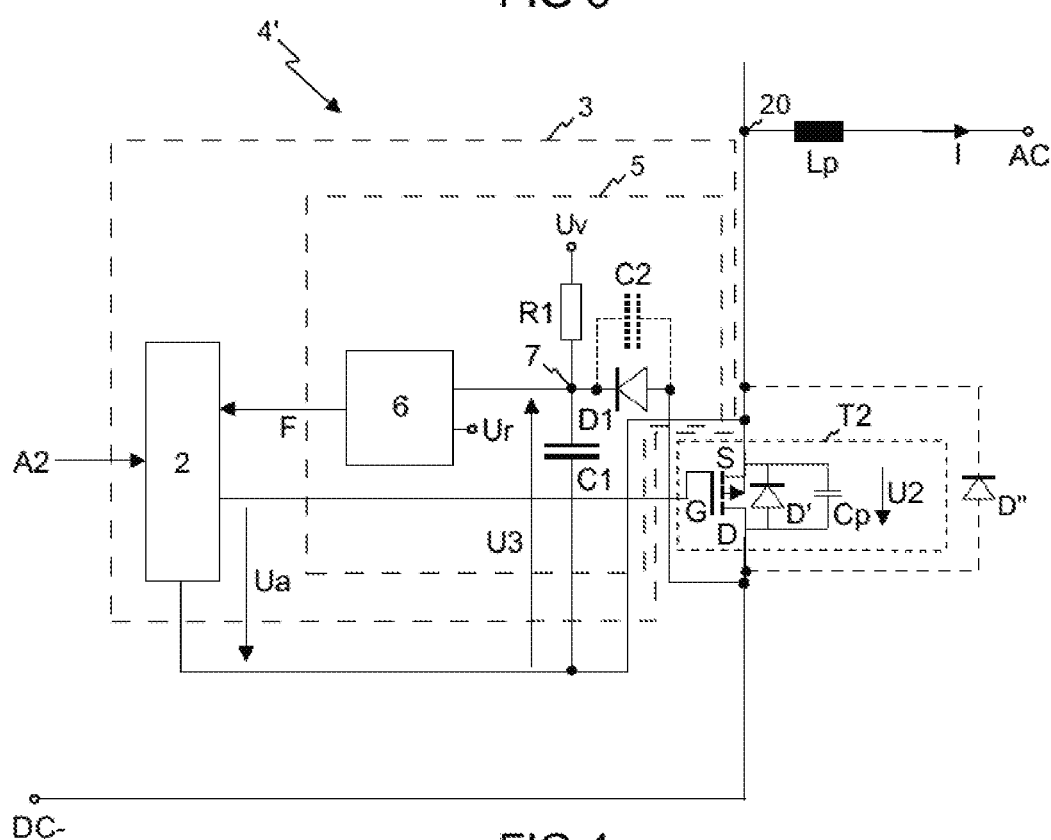
FIG. 4 shows a further power semiconductor circuit according to the invention.

In the exemplary embodiment in accordance with FIGS. 1 and 3, first and second field effect transistors T1 and T2 are embodied as n-channel field effect transistors, to put it more precisely as n-channel MOSFETs, while in the exemplary embodiment in accordance with FIG. 4, first and second field effect transistors T1 and T2 are embodied as p-channel field effect transistors, to put it more precisely as p-channel MOSFETs.

First and second power semiconductor circuits 4 and 4' respectively comprise a control device 3 having a drive device 2 and an undervoltage detection circuit 5. The respective drive device 2 is designed for driving field effect transistor T1 or T2 and is electrically connected to the respective gate G of field effect transistor T1 or T2. Furthermore, the respective drive device 2 and the respective undervoltage detection circuit 5 are electrically connected to the respective source S of field effect transistor T1 or T2. The respective drive device 2 generates a respective drive voltage Ua at the respective control terminal G of the field effect transistor T1 or T2 inter alia depending on a respective control signal A1 or A2 which is respectively generated, e.g., by a superordinate controller (not illustrated) assigned jointly to the two drive devices 2. First and second field effect transistors T1 and T2 switch on and off depending on the magnitude of the respective drive voltage Ua. The respective control signal A1 or A2 can be present in the form of a switch-on command (e.g., in the form of a logic "1" present at the input of the respective drive device 2) which signals to the respective drive device 2 that field effect transistor T1 or T2 assigned to it is intended to be switched on, or can be present in the form of a switch-off command (e.g., in the form of a logic "0" present at the input of the respective drive device 2) which signals to the respective drive device 2 that field effect transistor T1 or T2 assigned to it is intended to be switched off.

The respective undervoltage detection circuit 5 is designed to generate an undervoltage detection signal F if the power semiconductor voltage U1 or U2 present between the drain and the source of the respective field effect transistor T1 or T2 falls below a specific voltage value Uw.

The respective drive device 2 is designed to switch on the respective field effect transistor T1 or T2 given the presence of a switch-on command—assigned to said drive device—for switching on the respective field effect transistor T1 or T2 and of the respective undervoltage detection signal F. In other words, the respective drive device 2 switches on field effect transistor T1 or T2 assigned to it only if both a switch-on command and an undervoltage detection signal are present, i.e. an undervoltage is detected by the undervoltage detection circuit 5.

If drive device 2 receives a switch-off command, drive device 2 preferably immediately switches off field effect transistor T1 or T2 assigned to it.

Figure 2:
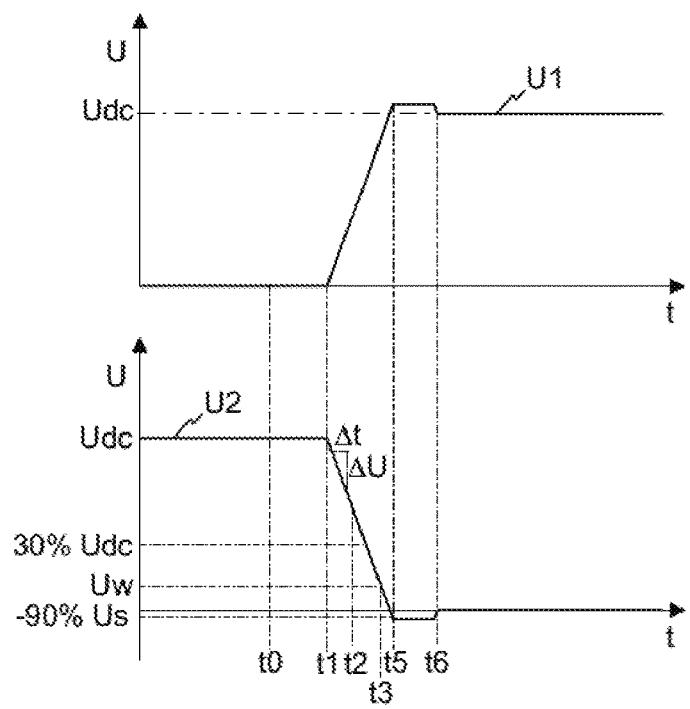
FIG. 2 shows schematic voltage profiles of the inventive circuit.

FIG. 2 illustrates the schematic voltage profiles and the instants which occur if, proceeding from the switching state that first field effect transistor T1 is switched on and the second field effect transistor T2 is switched off and a current I flows through first field effect transistor T1, first field effect transistor T1 is switched off and second field effect transistor T2 is switched on.

At the instant t0, drive device 2 of first power semiconductor circuit 4 receives from the superordinate controller a switch-off command and causes first field effect transistor T1 to be switched off, first field effect transistor T1 being completely switched off at the instant t1, i.e. at instant t1 current no longer flows from drain D of first field effect transistor T1 through first field effect transistor T1 to source S of first field effect transistor T1. Since the charge reversal of the gate capacitance of a field effect transistor requires a certain time, a temporal delay (t1−t0) between reception of the switch-off command and the actual complete switching-off of the field effect transistor always occurs. Preferably, at the instant t0 or shortly after the instant t0, in the exemplary embodiment at the instant t2, drive device 2 of second power semiconductor circuit 4' receives from the superordinate controller a switch-on command, which, however, since an undervoltage detection signal F has not yet been received by drive device 2 of second power semiconductor circuit 4' at this instant, is not implemented by the drive device 2 of second power semiconductor circuit 4'.

Once first field effect transistor T1 is switched off at instant t1, a charge-reversal process takes place in which parasitic capacitances Cp of first and second field effect transistors T1 and T2 that are present between source and drain are subjected to charge reversal. In this case, power semiconductor voltage U2 falls until at the instant t5 threshold voltage Us of internal freewheeling diode D' of second field effect transistor T2 or, if present, of external freewheeling diode D" of second power semiconductor circuit 4' is exceeded and the relevant freewheeling diode D' or D" becomes conducting and carries the current I. Threshold voltage Us is the voltage at which the freewheeling diode D' or D" becomes conducting in the forward direction, that is to say a current flow through the freewheeling diode D' or D" begins to be initiated. The threshold voltage Us is generally approximately 0.7 V, e.g. in the case of silicon-based freewheeling diodes, wherein the threshold voltage Us may also be significantly lower, e.g., with the use of Schottky diodes as freewheeling diodes. Threshold voltage Us may also be significantly higher in the case of freewheeling diodes based, e.g., on silicon carbide.

In the freewheeling diode D' or D" of second power semiconductor circuit 4' or in the second power semiconductor circuit 4', particularly few energy losses arise if second field effect transistor T2 is switched on in the region of the zero crossing of power semiconductor voltage U2 and is ideally switched on at the zero crossing of power semiconductor voltage U2. From an energy standpoint, this correspondingly holds true in the same way for the freewheeling diode D' or D" of first power semiconductor circuit 4 or for first power semiconductor circuit 4 if first field effect transistor T1 is switched on in the region of the zero crossing of power semiconductor voltage U1 and is ideally switched on at the zero crossing of power semiconductor voltage U1.

At the instant t3, the power semiconductor voltage U2 falls below the specific voltage value Uw, such that undervoltage detection circuit 5 of second power semiconductor circuit 4' generates undervoltage detection signal F. Drive device 2 of second power semiconductor circuit 4' receives undervoltage detection signal F and, since both undervoltage detection signal F and a switch-on command for second field effect transistor T2 are present, causes second field effect transistor T2 to be switched on, said second field effect transistor being completely switched on at the instant t6. Since the charge reversal of the gate capacitance of a field effect transistor requires a certain time, a temporal delay (t6–t3) between reception of undervoltage detection signal F by drive device 2 of second power semiconductor circuit 4 and the actual complete switching-on of second field effect transistor T2 always occurs.

What is achieved by drive device 2 in conjunction with undervoltage detection circuit 5 is that the freewheeling diode D' or D" is always bridged in the region of the zero crossing of the power semiconductor voltage present across it as a result of the switching-on of the relevant field effect transistor connected in antiparallel with it and, consequently, the freewheeling diode D' or D" must carry the full current I at most only for a very short period of time before the majority of the current I is accepted by the field effect transistor connected in antiparallel with it. This exploits the fact that field effect transistors have the property that, when they are switched on, they can conduct current in the reverse direction as well, i.e. in the direction from the source to the drain of the field effect transistor in the case of n-channel field effect transistors and in the direction from the drain to the source of the field effect transistor in the case of p-channel field effect transistors, without being destroyed or damaged.

In the case of a customary power semiconductor circuit in the art, in contrast thereto, it is not until after a relatively long, fixedly predefined time duration that second field effect transistor T2, after first field effect transistor T1 has received the switch-off signal, is switched on, such that second field effect transistor T2 in FIG. 2 in the case of a customary power semiconductor circuit in the art is not switched on until a relatively long time after the instant t6 and relatively high energy losses thus arise at the freewheeling diode D' or D". In order to compensate for the temporal delay (t6–t3) between reception of the undervoltage detection signal F by drive device 2 of second power semiconductor circuit 4 and the actual complete switching-on of second field effect transistor T2 and to achieve complete switching-on as closely as possible to the zero crossing of the power semiconductor voltage U2 present across said transistor, it is advantageous if the specific voltage value Uw is between 0 volts and +30% of the power semiconductor voltage U2 present in a steady-state fashion in the switched-off state of the second field effect transistor T2 during the operation of the second power semiconductor circuit 4'. In the context of the exemplary embodiment, power semiconductor voltage U2 present in steady-state fashion in the switched-off state of second field effect transistor T2 during the operation of second power semiconductor circuit 4' corresponds to the DC voltage Uk present across the series connection comprising first and second field effect transistors T1 and T2, since, during the operation of second power semiconductor circuit 4', first power semiconductor circuit 4 is also in operation, and first field effect transistor T1 is switched on if second field effect transistor T2 is switched off, such that the DC voltage Uk is present between the drain D and the source S of second field effect transistor T2 in the switched-off state of second field effect transistor T2. In this case, the term "in steady-state fashion" is taken to mean the power semiconductor voltage U2 in the settled state, such that, e.g., momentary voltage overshoots of power semiconductor voltage U2 that are possibly present and occur directly during switching actions are disregarded.

If the intention is to ensure that, upon the commutation of the current I from first field effect transistor T1 to second field effect transistor T2, no parallel-path current, i.e. no current from the positive DC voltage terminal DC+ through first field effect transistor T1 and second field effect transistor T2 to the negative DC voltage terminal DC−, can occur if, e.g., first and second field effect transistors T1 and T2 differ greatly in their switching behavior, e.g., on account of large component tolerances, it is advantageous if the specific voltage value Uw is a value ranging from a negative value whose absolute value is about 90% of the threshold voltage Us of an antiparallel-connected internal freewheeling diode D' of second field effect transistor T2 or of an external freewheeling diode D" connected in antiparallel with second field effect transistor T2 to about 0 volts.

It is thus advantageous if the specific voltage value Uw is between a negative value whose absolute value is about 90% of the threshold voltage Us of an antiparallel-connected internal freewheeling diode D' of second field effect transistor T2 or of an external freewheeling diode D" connected in antiparallel with second field effect transistor T2 and about +30% of power semiconductor voltage U2 present in steady-state fashion in the switched-off state of second field effect transistor T2 during the operation of second power semiconductor circuit 4'. FIG. 2 illustrates the advantageous limits of the specific voltage value Uw.

Preferably, the value of the specific voltage value Uw is dependent on a rate Vu of change of power semiconductor voltage U2 that occurs directly before second field effect transistor T2 is switched on, and at a higher rate Vu of change of power semiconductor voltage U2 said value is higher than at a low rate Vu of change. In this case, the rate Vu of change of power semiconductor voltage U2 is defined as the absolute value of the quotient of the change ΔU in power semiconductor voltage U2 over a specific time period Δt divided by the specific time period Δt(Vu=|ΔU/Δt|). What can be achieved as a result is that, if the power semiconductor voltage U2 falls rapidly, second field effect transistor T2 is switched on more rapidly than in the case of a slowly falling power semiconductor voltage U2. As a result, switching of second field effect transistor T2 with as little energy loss as possible is ensured even in the case of greatly varying load or operating conditions occurring during the operation of second power semiconductor circuit 4'.

If appropriate, drive device 2 can be designed in such a way that, upon reception of a switch-on command, after a specific waiting time has elapsed, it switches on field effect transistor T1 or T2 assigned to it independently of the presence of an undervoltage detection signal F. The waiting time is preferably from about 3 ns to about 8 μs. If for some reason, e.g., in the case of an extreme operating situation of power semiconductor circuit 4', power semiconductor voltage U2 does not fall below specific voltage value Uw for a longer time, after a waiting time has elapsed after reception of a switch-on command by drive device 2, second field effect transistor T2 is switched on in any case by drive device 2.

First and second field effect transistors T1 and T2 are preferably respectively embodied as MOSFETs or JFETs.

FIG. 3 illustrates second power semiconductor circuit 4' and in particular an advantageous embodiment of the undervoltage detection circuit 5 in detail, wherein first and second power semiconductor circuits 4 and 4' are embodied identically. In this case, first and second field effect transistors T1 and T2 are embodied as p-channel field effect transistors.

The respective undervoltage detection circuit 5 of first and second power semiconductor circuits 4 and 4' comprises a limit value monitoring unit 6, a first diode D1, a first capacitor C1 and an electrical resistor R1, wherein a first input of limit value monitoring unit 6, a first terminal of first capacitor C1, the anode of first diode D1 and the first terminal of resistor R1 are electrically connected to an electrical circuit node 7, wherein the cathode of first diode D1 is electrically connected to drain D of the field effect transistor T1 or T2 assigned to the respective undervoltage detection circuit 5, wherein a second terminal of first capacitor C1 is electrically connected to source S of the respective field effect transistor T1 or T2, wherein the limit value monitoring unit 6 is designed to generate an undervoltage detection signal F if the power semiconductor voltage U1 or U2 present between drain D and source S of field effect transistor T1 or T2 assigned to the respective undervoltage detection circuit 5 falls below the specific voltage value Uw, such that electrical voltage U3 present between the first input of limit value monitoring unit 6 and drain D of field effect transistor T1 or T2 assigned to the respective undervoltage detection circuit 5 thus falls below a reference voltage Ur present at the second input of limit value monitoring unit 6.

A charging voltage Uv is preferably present at a second terminal of electrical resistor R1. The magnitude of the specific voltage value Uw is defined by the choice of the magnitude of reference voltage Ur. In the context of the exemplary embodiment, the charging voltage Uv and reference voltage Ur are generated by an internal circuit of undervoltage detection circuit 5, which is not illustrated in FIG. 3 for the sake of clarity and since it is not essential to the understanding of the invention. Alternatively, the second terminal of electrical resistor R1 can also be electrically connected to the second terminal of first capacitor C1 (not illustrated in FIG. 3). A particularly simple construction of undervoltage detection circuit 5 is thereby made possible.

The respective limit value monitoring unit 6 can have a second capacitor C2 instead of the first diode D1 or in addition to the first diode D1, wherein a first terminal of second capacitor C2 is electrically connected to electrical circuit node 7 and a second terminal of second capacitor C2 is electrically connected to drain D of field effect transistor T1 or T2 assigned to respective undervoltage detection circuit 5. Second capacitor C2 enables a capacitive overcoupling of the power semiconductor voltage U1 or U2 to the respective circuit node 7. The higher the capacitance of second capacitor C2 and the higher rate Vu of change of power semiconductor voltage U1 or U2, the more power semiconductor voltage U1 or U2 couples over to respective circuit node 7, such that electrical voltage U3 present between the first input of limit value monitoring unit 6 and drain D of field effect transistor T1 or T2 assigned to the respective undervoltage detection circuit 5 changes more at a higher rate Vu of change than at a low rate Vu of change. As a result, the above-described dependence of the specific voltage value Uw on rate Vu of change of power semiconductor voltage U2 that occurs directly before the second field effect transistor T2 is switched on can be achieved, such that the value of the specific voltage value Uw is higher at a higher rate Vu of change of the power semiconductor voltage U2 than at a low rate Vu of change.

FIG. 4 illustrates the second power semiconductor circuit 4' and in particular an advantageous embodiment of the undervoltage detection circuit 5, wherein first and second power semiconductor circuits 4 and 4' are embodied identically. In this case, in contrast to FIG. 3, the first and second field effect transistors T1 and T2 are embodied as p-channel field effect transistors. The source and drain terminals of first and second field effect transistors T1 and T2 are thus interchanged in FIG. 4 relative to FIG. 3 or FIG. 1. The exemplary embodiment in accordance with FIG. 4 otherwise corresponds, including possible advantageous embodiments and alternative embodiments of features and in terms of the functioning thereof, to the exemplary embodiment in accordance with FIG. 3 apart from the features that, in the exemplary embodiment in accordance with FIG. 4, the cathode of first diode D1 is electrically connected to electrical circuit node 7 and the anode of first diode D1 is electrically connected to drain D of field effect transistor T1 or T2 assigned to the respective undervoltage detection circuit 5.

In the case of the invention, electrical voltage U3 present between the first input of the respective limit value monitoring unit 6 and source S of first or second field effect transistor T1 or T2 is related to the source S of first or second field effect transistor T1 or T2 of the respective power semiconductor circuit 4 or 4' in the case of an embodiment of the first or second field effect transistor T1 or T2 as an n-channel field effect transistor (see FIG. 3) and is related to the first input of the limit value monitoring unit 6 of the respective power semiconductor circuit 4 or 4' in the case of an embodiment of the first or second field effect transistor T1 or T2 as a p-channel field effect transistor (see FIG. 4).

FIG. 2 illustrates the schematic voltage profiles and the instants which occur if, proceeding from the switching state that the first field effect transistor T1 is switched on and the second field effect transistor T2 is switched off and a current I flows through the first field effect transistor T1, the first field effect transistor T1 is switched off and the second field effect transistor T2 is switched on. If, conversely, proceeding from the switching state where the second field effect transistor T2 is switched on and the first field effect transistor T1 is switched off and a current I flows through second field effect transistor T2, second field effect transistor T2 is switched off and first field effect transistor T1 is switched on, the switching process proceeds in a corresponding manner, wherein the designations of the power semiconductor voltage U1 and U2 in FIG. 2 should be interchanged and conceptually first and second field effect transistors T1 and T2 or conceptually the first and second power semiconductor circuits 4 and 4' should be interchanged in the associated description concerning FIG. 2.

It should be noted that even further first field effect transistors can be electrically connected in parallel with first field effect transistor T1 and that even further second field effect transistors can be electrically connected in parallel with second field effect transistor T2. The current-carrying capacity of first and second power semiconductor circuits 4 and 4' can be increased as a result.

Furthermore, it should be noted that, of course, features of different exemplary embodiments of the invention, provided that the features are not mutually exclusive, can be combined arbitrarily with one another.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor circuit comprising:
   a field effect transistor having a drain, a source and a gate as terminals; and
   a control device having a drive device and an undervoltage detection circuit;
   wherein said drive device is coupled to drive said field effect transistor and is electrically connected to said gate of said field effect transistor;
   wherein said undervoltage detection circuit generates an undervoltage detection signal if a power semiconductor voltage present between said drain and said source of said field effect transistor falls below a specific voltage value (Uw);
   wherein the value of said specific voltage value (Uw) is dependent on a rate of change of said power semiconductor voltage that occurs directly before said field effect transistor is switched on, and at a higher rate of change of said power semiconductor voltage said value is higher than at a low rate of change; and
   wherein said drive device switches on said field effect transistor upon the occurrence of the condition that both a switch-on command for switching on said field effect transistor and said undervoltage detection signal are present.

2. The power semiconductor circuit of claim 1,
   wherein said field effect transistor further includes a FET diode having a threshold voltage, and being one of an antiparallel-connected internal freewheeling diode and an external freewheeling diode connected in antiparallel with said field effect transistor;
   wherein said specific voltage value (Uw) is between a negative value whose absolute value is about 90% of said threshold voltage of said FET diode and about +30% of said power semiconductor voltage present in steady-state fashion in the switched-off state of said field effect transistor during the operation of the power semiconductor circuit.

3. The power semiconductor circuit of claim 2,
   wherein the value of said specific voltage value (Uw) is dependent on a rate of change of said power semiconductor voltage that occurs directly before said field effect transistor is switched on, and at a higher rate of change of said power semiconductor voltage said value is higher than at a low rate of change.

4. The power semiconductor circuit of claim 1, wherein said field effect transistor is embodied as one of a MOSFET and a JFET.

5. The power semiconductor circuit according to claim 1,
   wherein said field effect transistor is embodied as an n-channel field effect transistor;
   wherein said undervoltage detection circuit has a limit value monitoring unit, a first diode with an anode and a cathode, a first capacitor and an electrical resistor;
   wherein a first input of said limit value monitoring unit, a first terminal of said first capacitor, said anode of said first diode and said first terminal of said resistor are electrically connected to an electrical circuit node;
   wherein said cathode of said first diode is electrically connected to said drain of said field effect transistor;
   wherein a second terminal of said first capacitor is electrically connected to said source of said field effect transistor; and
   wherein said limit value monitoring unit generates an undervoltage detection signal when said power semiconductor voltage present between said drain and said source of said field effect transistor falls below said specific voltage value (Uw), such that said electrical voltage present between said first input of said limit value monitoring unit and said source of said field effect transistor thus falls below a reference voltage present at said second input of said limit value monitoring unit.

6. The power semiconductor circuit of claim 5
   wherein said limit value monitoring unit further includes a second capacitor;
   wherein a first terminal of said second capacitor is electrically connected to said electrical circuit node and a second terminal of said second capacitor is electrically connected to said drain of said field effect transistor.

7. The power semiconductor circuit of claim 1,
   wherein said field effect transistor is embodied as a p-channel field effect transistor;
   wherein said undervoltage detection circuit has a limit value monitoring unit, a first capacitor, a first diode with an anode and a cathode, and an electrical resistor;
   wherein a first input of said limit value monitoring unit, a first terminal of said first capacitor, said cathode of said first diode and said first terminal of said resistor are electrically connected to an electrical circuit node;
   wherein said anode of said first diode is electrically connected to said drain of said field effect transistor;
   wherein a second terminal of said first capacitor is electrically connected to said source of said field effect transistor;
   wherein said limit value monitoring unit generates an undervoltage detection signal when said power semiconductor voltage present between said drain and said source of said field effect transistor falls below said specific voltage value (Uw), such that said electrical voltage present between said first input of said limit value monitoring unit and said source of said field effect transistor thus falls below a reference voltage present at said second input of said limit value monitoring unit.

8. The power semiconductor circuit of claim 7,
wherein said limit value monitoring unit further includes a second capacitor;
wherein a first terminal of said second capacitor is electrically connected to said electrical circuit node and a second terminal of said second capacitor is electrically connected to said drain of said field effect transistor.

9. The power semiconductor circuit according to claim 1,
wherein said field effect transistor is embodied as an n-channel field effect transistor;
wherein said undervoltage detection circuit has a limit value monitoring unit, a first capacitor, a second capacitor and an electrical resistor;
wherein a first input of said limit value monitoring unit, a first terminal of said first capacitor, a first terminal of said second capacitor and said first terminal of said resistor are electrically connected to an electrical circuit node;
wherein a second terminal of said second capacitor is electrically connected to said drain of said field effect transistor;
wherein a second terminal of said first capacitor is electrically connected to said source of said field effect transistor; and
wherein said limit value monitoring unit generates an undervoltage detection signal when said power semiconductor voltage present between said drain and said source of said field effect transistor falls below said specific voltage value (Uw), such that said electrical voltage present between said first input of said limit value monitoring unit and said source of said field effect transistor thus falls below a reference voltage present at said second input of said limit value monitoring unit.

10. The power semiconductor circuit of claim 1,
wherein said field effect transistor is embodied as a p-channel field effect transistor;
wherein said undervoltage detection circuit has a limit value monitoring unit, a first capacitor, a second capacitor and an electrical resistor;
wherein a first input of said limit value monitoring unit, a first terminal of said first capacitor, a first terminal of said second capacitor and said first terminal of said resistor are electrically connected to an electrical circuit node;
wherein a second terminal of said second capacitor is electrically connected to said drain of said field effect transistor;
wherein a second terminal of said first capacitor is electrically connected to said source of said field effect transistor;
wherein said limit value monitoring unit generates an undervoltage detection signal when said power semiconductor voltage present between said drain and said source of said field effect transistor falls below said specific voltage value (Uw), such that said electrical voltage present between said first input of said limit value monitoring unit and said source of said field effect transistor thus falls below a reference voltage present at said second input of said limit value monitoring unit.

11. A semiconductor bridge circuit arrangement comprising a first and a second power semiconductor circuit,
each of said first and second power semiconductor circuits including:
a field effect transistor having a drain, a source and a gate as terminals; and
a control device having a drive device and an undervoltage detection circuit;
wherein said drive device is coupled to drive said field effect transistor and is electrically connected to said gate of said field effect transistor;
wherein said undervoltage detection circuit generates an undervoltage detection signal if a power semiconductor voltage present between said drain and said source of said field effect transistor falls below a specific voltage value (Uw);
wherein the value of said specific voltage value (Uw) is dependent on a rate of change of said power semiconductor voltage that occurs directly before said field effect transistor is switched on, and at a higher rate of change of said power semiconductor voltage said value is higher than at a low rate of change; and
wherein said drive device switches on said field effect transistor upon the occurrence of the condition that both a switch-on command for switching on said field effect transistor and said undervoltage detection signal are present;
wherein said field effect transistor of said second power semiconductor circuit is electrically connected in series with said field effect transistor of said first power semiconductor circuit.

* * * * *